United States Patent
Lee et al.

(10) Patent No.: US 6,569,599 B2
(45) Date of Patent: May 27, 2003

(54) PARTIALLY CROSSLINKED POLYMER FOR BILAYER PHOTORESIST

(75) Inventors: Geun Su Lee, Ichon-shi (KR); Jae Chang Jung, Ichon-shi (KR); Min Ho Jung, Ichon-shi (KR); Ki Ho Baik, Ichon-shi (KR)

(73) Assignee: Hynix Semiconductor Inc., Kyoungki (KR)

( * ) Notice: Subject to any disclaimer, the term of this patent is extended or adjusted under 35 U.S.C. 154(b) by 34 days.

(21) Appl. No.: 09/852,371

(22) Filed: May 10, 2001

(65) Prior Publication Data

US 2002/0028406 A1 Mar. 7, 2002

(30) Foreign Application Priority Data

Jun. 21, 2000 (KR) .......................... 2000-34102

(51) Int. Cl.$^7$ ............................ G03F 7/004; C08F 30/08
(52) U.S. Cl. .................... 430/270.1; 430/326; 430/311; 430/905; 430/910; 526/279; 526/281; 556/431
(58) Field of Search ............... 430/270.1, 311, 430/326, 910; 526/279, 281; 556/431; 560/120

(56) References Cited

U.S. PATENT DOCUMENTS

2001/0004510 A1 * 6/2001 Wheeler .................. 430/270.1
2001/0031420 A1 * 10/2001 Lee et al. ................ 430/270.1
2002/0028406 A1 * 3/2002 Lee et al. ................ 430/270.1

FOREIGN PATENT DOCUMENTS

WO      WO 8601219 A * 2/1986 ............ C08L/83/00

OTHER PUBLICATIONS

Office Action dated Nov. 18, 2002 from the Taiwan Intellectual Property Office (4 pages).

* cited by examiner

Primary Examiner—Janet Baxter
Assistant Examiner—Yvette C. Thornton
(74) Attorney, Agent, or Firm—Marshall, Gerstein & Borun

(57) ABSTRACT

The present invention provides photoresist polymers, processes for producing the same, photoresist compositions comprising such polymers, and processes for producing a photoresist pattern using such photoresist compositions. In particular, photoresist polymers of the present invention comprise a moiety of the Formula:

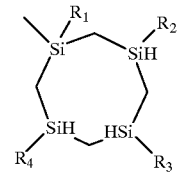

where $R_1$, $R_2$, $R_3$ and $R_4$ are those defined herein. Photoresist polymers of the present invention have a relatively high etching resistance, and therefore are useful in thin resist processes and bilayer photoresist processes. Moreover, photoresist polymers of the present invention have a high contrast ratio between the exposed region and the non-exposed region.

33 Claims, 4 Drawing Sheets

PARTIALLY CROSSLINKED POLYMER FOR BILAYER PHOTORESIST

BACKGROUND OF THE INVENTION

1. Field of the Invention

The present invention relates to photoresist polymers suitable for a bilayer photoresist and photoresist compositions containing such polymers. In particular, the present invention relates to photoresist monomers comprising a silicon moiety.

2. Description of the Background Art

Some semiconductor manufacturing processes use photoresist copolymers derived from a monomer comprising an alicyclic compound to form ultrafine patterns. However, the yield of photoresist polymers from these compounds is relatively low resulting in increased manufacturing costs. While the yield of acrylates polymerization is high, the resulting photoresist polymers have a weak etching resistance, thereby limiting its use.

Forming an ultrafine pattern below 0.13 μm using a conventional photoresist coating thickness results in a high aspect ratio which may cause the pattern to collapse. And if the coating thickness is reduced, the resulting photoresist coating often has low or no etching resistance. Thus, it is difficult to perform following, or successive processes after etching process using conventional photoresist polymers.

One method for overcoming the above described limitations is to use a "thin resist-hard mask" process, which generally involves reducing a coating thickness of the photoresist composition and introducing a hard mask below the photoresist film coating. Another method is to use a bilayer photoresist comprising silicon, which involves coating a bottom anti-reflective coating material (BARC), g-line photoresist or i-line photoresist on the substrate and then coating a silicon comprising photoresist thereon. The resulting photoresist film is exposed, and the upper layer (i.e., photoresist comprising silicon) is wet developed to form an upper layer photoresist pattern. The lower layer is dry developed using $O_2$ plasma and the upper photoresist pattern as a mask to form a lower layer resist pattern. This process reduces or eliminates the occurrence of photoresist pattern collapse.

SUMMARY OF THE INVENTION

It is therefore an object of the present invention to provide photoresist monomers comprising silicon, photoresist polymers for bilayer resist derived from the same, and a process for preparing such photoresist polymers.

Another object of the present invention is to provide photoresist compositions comprising such photoresist polymers.

Still another object of the present invention is to provide a semiconductor device produced by using such a photoresist composition.

DETAILED DESCRIPTION OF THE PREFERRED EMBODIMENTS

Figure 1:
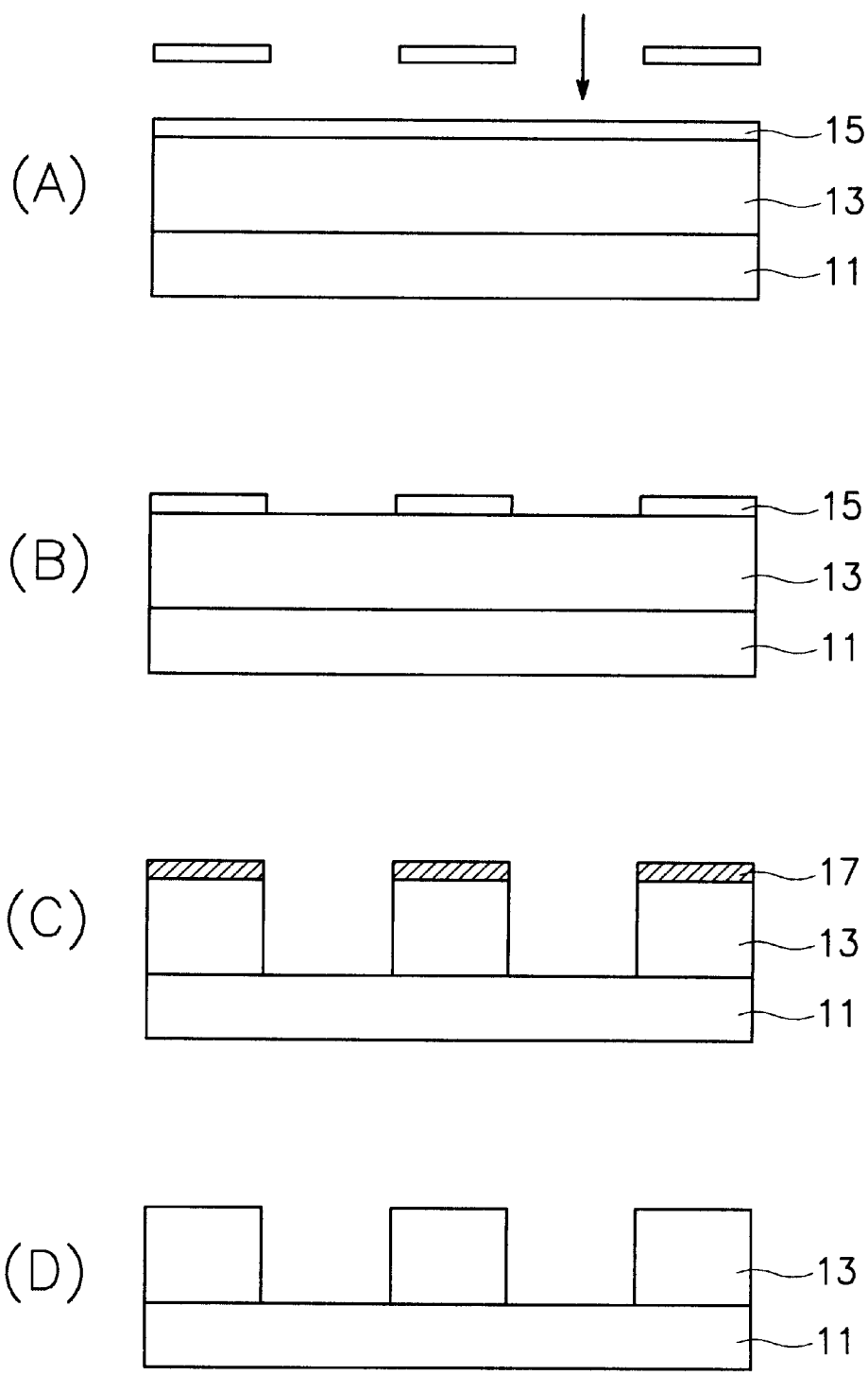
FIG. 1 illustrates a process for forming a photoresist pattern in accordance with a preferred embodiment of the present invention.

One aspect of the present invention provides a photoresist polymer derived from monomers comprising (i) a first monomer selected from the group consisting of compounds of the Formulas 1 to 3, or mixtures thereof:

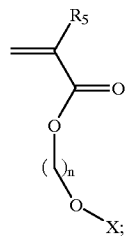

1

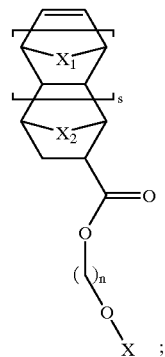

2

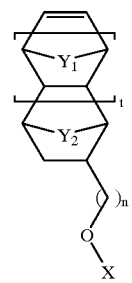

3 where each of $X_1$, $X_2$, $Y_1$ and $Y_2$ is independently alkylene, preferably methylene or ethylene;

$R_5$ is a hydrogen or alkyl, preferably hydrogen or methyl;

s and t are integers from 0 to 2;

n is an integer from 1 to 5; and

X is a moiety of the formula:

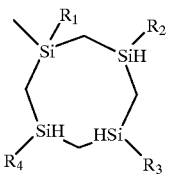

4 where each of $R_1$, $R_2$, $R_3$ and $R_4$ is independently hydrogen, $C_1$–$C_{10}$ alkyl, or $C_1$–$C_{10}$ alkyl comprising an ether linkage (ii) a second monomer of the Formula 5:

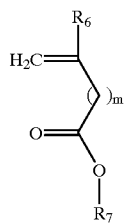

5 where
R$_6$ is hydrogen or alkyl, preferably hydrogen or methyl;
R$_7$ is an acid labile protecting group; and
m is an integer from 0 to 5; and (iii) a third monomer of the Formula 6

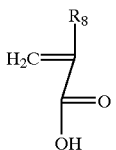

6 where
R$_8$ is hydrogen or alkyl, preferably hydrogen or methyl.

Preferably, the acid labile protecting group of compound of Formula 5 is selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl and 2-acetylmenth-1-yl.

Photoresist polymers of the present invention include a monomer comprising a silicon rich moiety of Formula 4. Preferably, photoresist polymers of the present invention comprise from about 7 to about 30 wt % of silicon. Without being bound by any theory, it is believed that an excellent etching resistance to oxygen afforded by the present photoresist polymers is due to the presence of such a relatively high amount of silicon. This etching resistance to oxygen makes photoresist polymers of the present invention useful in a bilayer photoresist process. The present inventors have found that even a thin coating of photoresist polymers of the present invention provides a successful ultrafine pattern formation.

In one particular embodiment of the present invention, the first monomer is selected from the group consisting of compounds of the formula:

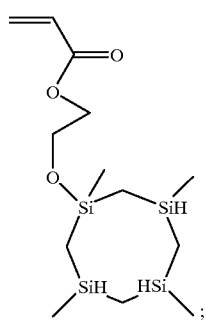

1A

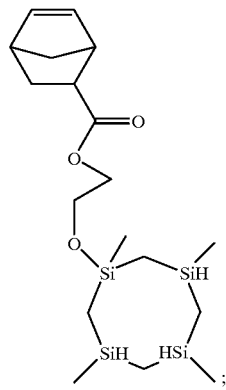

2A

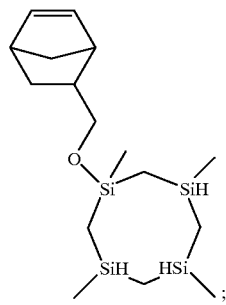

3A and mixtures thereof

The monomer used to produce photoresist polymers of the present invention can further comprise a fourth monomer which can provide cross-linkage within the photoresist polymer. Preferably, the fourth monomer is a compound of the formula:

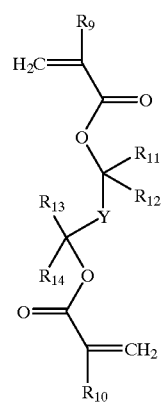

7 where
Y is C$_1$–C$_{12}$ alkylene, oxygen, or C$_1$–C$_{12}$ alkylene comprising an ether linkage;
each of R$_9$ and R$_{10}$ is independently hydrogen or alkyl, preferably hydrogen or methyl; and
each of R$_{11}$, R$_{12}$, R$_{13}$ and R$_{14}$ is independently hydrogen, C$_1$–C$_{12}$ alkyl, or C$_1$–C$_{12}$ alkyl comprising an ether linkage.

The diacrylate crosslinking compound of Formula 7 improves the polymerization yield of the polymer. In addition, the hydrophobic property in a non-exposed region of the photoresist is significantly increased due to the crosslinking. As a result, the developing solution does not remove any significant amount of the photoresist polymer in the non-exposed region, but the photoresist polymer in the exposed region is efficiently removed by the developing solution. Therefore, the contrast ratio between the exposed region and the non-exposed region of photoresist polymers of the present invention is significantly increased.

The monomer used to produce photoresist polymers of the present invention can further comprise maleic anhydride as a fifth monomer. Maleic anhydride also increases the polymerization yield of the polymer.

In one particular embodiment, photoresist polymers of the present invention is selected from the group of consisting of polymers of the Formulas 8 to 10:

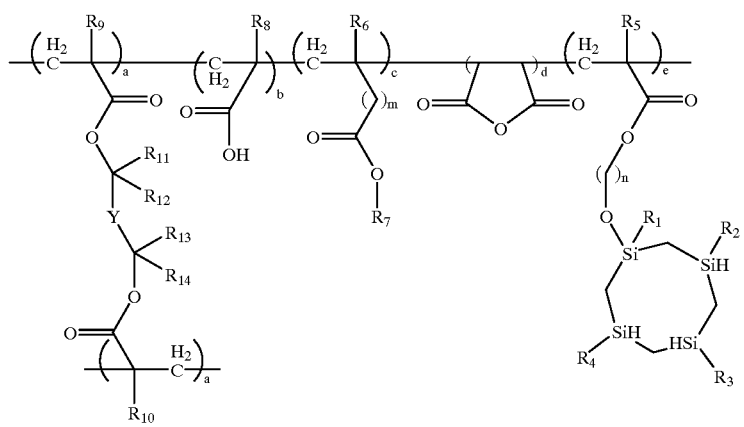

8

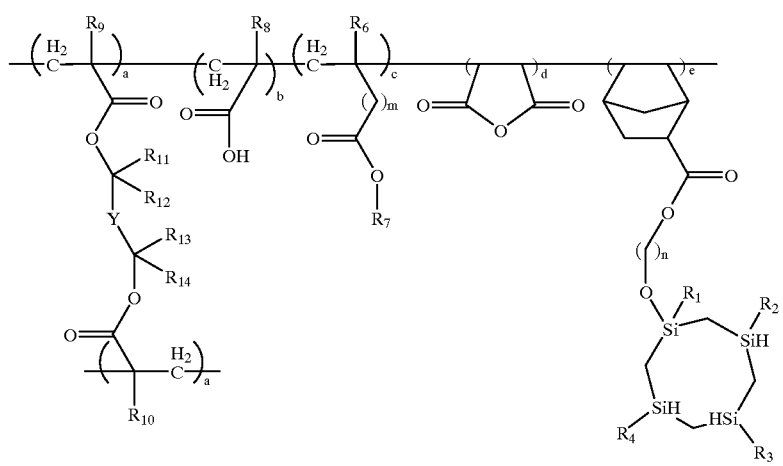

9

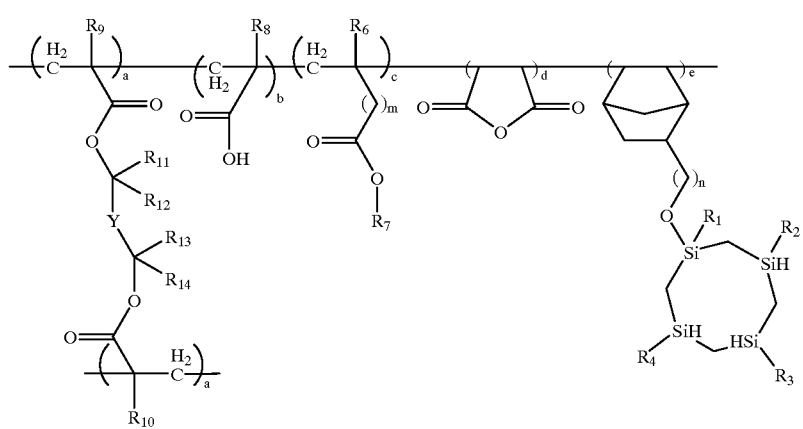

10 where $R_1, R_2, R_3, R_4, R_5, R_6, R_7, R_8, R_9, R_{10}, R_{11}, R_{12}, R_{13}, R_{14}$, n and m are those defined above; and a, b, c, d, and e individually denote the mole ratio of each monomer, preferably with proviso that b, c and d are not 0.

The terminal groups of polymers depicted in the present disclosure depend on the polymerization initiator and/or the polymerization terminator used. In addition, as used throughout this disclosure, it should be appreciated that the order of monomeric units represented in polymer formulas of the present disclosure does not necessarily indicate the actual order of such monomeric units in the polymers. Monomeric units represented in polymer formulas are intended to simply indicate the presence of such monomeric units in the polymer. Moreover, the variables represent the total relative ratio of each unit. For example, the total amount "d" in Formulas 8–10 above can be inter dispersed throughout the polymer (not necessarily in same concentrations) or all or majority of such polymeric unit can be concentrated in one particular location of the polymer.

Preferably, the ratio of a:b:c:d:e is 0–15 mol %: 1–25 mol %: 4–25 mol %: 0–30 mol %: 1–35 mol %.

Preferred polymers of the present invention include polymers of the formula:

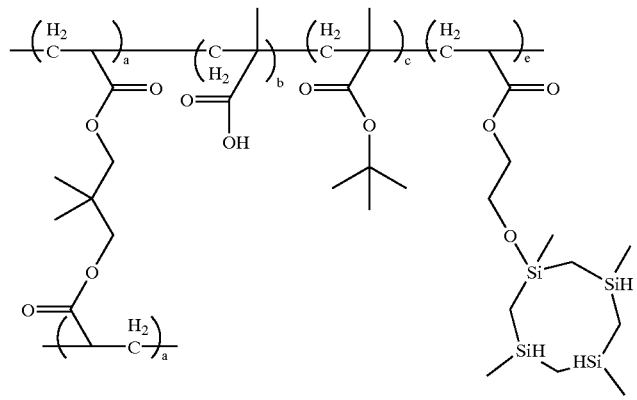

8A

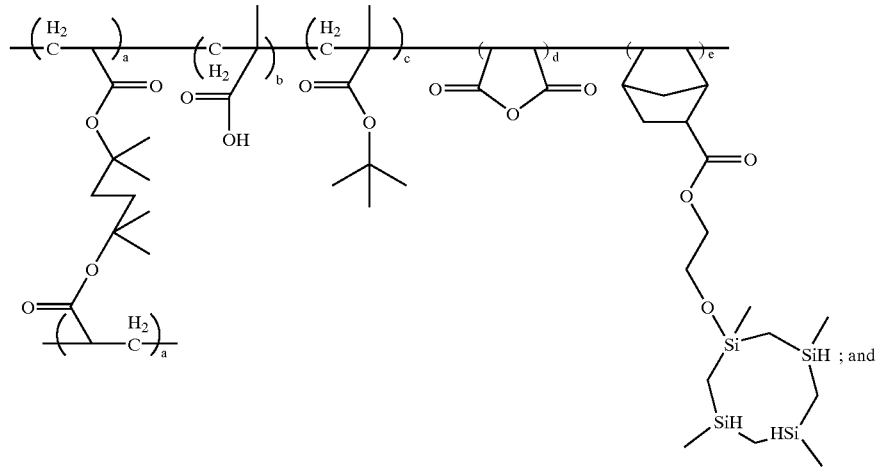

9A

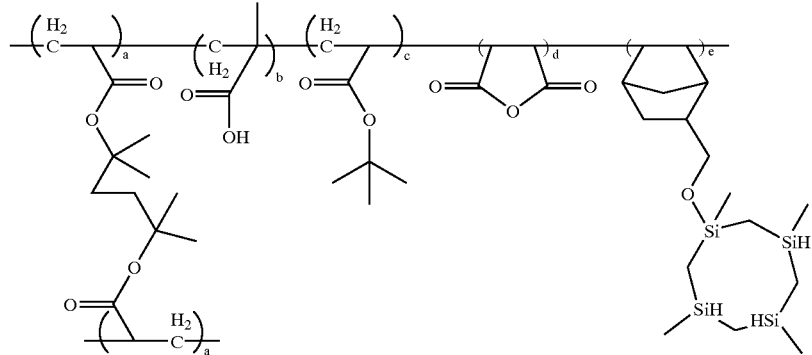

10A

Preferably, the molecular weight of the polymer is in the range of from about 3,000 to about 50,000, more preferably from about 3,000 to about 30,000.

Photoresist polymers of the present invention can be prepared using a variety of methods including a radical polymerization of monomers with a conventional radical polymerization initiator. An exemplary procedure for preparing polymers of the present invention includes the steps of:

(a) admixing
   (i) a monomer selected from the group consisting of compounds of Formulas 1 to 3, and mixtures thereof,
   (ii) a second monomer of Formula 5;
   (iii) a third monomer of Formula 6; and
   (iv) a fourth monomer of Formula 7, maleic anhydride, or mixtures thereof; and
(b) polymerizing said admixture under conditions sufficient to produce said photoresist polymer, preferably in an inert atmosphere, e.g., nitrogen or argon.

The polymerization process can be a bulk polymerization or a solution polymerization using any inert solvent. If a solution polymerization process is used, the polymerization solvent is preferably selected from the group consisting of tetrahydrofuran, dimethylformamide, chloroform, ethylacetate, acetone, ethylmethylketone, dimethylsulfoxide, dioxane, benzene, toluene, xylene, and mixtures thereof.

When the polymer is prepared in a solid state, i.e., under reaction conditions such that the polymer precipitated from the reaction mixture, preferably the polymerization solvent is selected from the group consisting of diethyl ether, petroleum ether, n-hexane, cyclohexane, methanol, ethanol, propanol and isopropyl alcohol, preferably diethyl ether, petroleum ether and n-hexane.

An exemplary polymerization initiator is selected from the group consisting of 2,2'-azobisisobutyronitrile (AIBN), benzoyl peroxide, acetyl peroxide, lauryl peroxide, tert-butyl peroxide and bisazide compounds.

The polymerization reaction is generally performed at from about 50 to about 120° C., preferably from about 50 to about 80° C. with a typical reaction time of from about 4 to 24 hours.

The present invention also provides a photoresist composition comprising (i) a photoresist polymer described above, (ii) a photoacid generator, and (iii) an organic solvent.

Photoacid generators include onium type compounds, halogen compounds, diazoketone compounds, sulfone compounds and sulfonic acid compounds. More preferably, the onium type compounds containing sulfides and iodide are employed. In one particular embodiment of the present invention, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate, and mixtures thereof.

Typically, the amount of photoacid generator used is from about 0.05% by weight to about 10% by weight of the photoresist polymer. It has been found by the present inventors that when the amount of photoacid generator used is less than about 0.05%, the photosensitivity of the photoresist composition is significantly decreased. And when the amount of photoacid generator used is greater than about 10%, a poor pattern formation results, presumably due to its high absorption of deep ultra violet light (DUV).

The organic solvent is preferably selected from the group consisting of cyclohexanone, cyclopentanone, methyl 3-methoxypropionate, ethyl 3-ethoxypriopionate and propyleneglycol methyletheracetate. The amount of the organic solvent used is preferably in the range of from about 500% by weight to about 2000% by weight of the photoresist polymer. When the amount of the solvent in the photoresist composition is about 1000% by weight of the polymer, a photoresist film having thickness of 0.2 μm can be readily obtained.

Another aspect of the present invention provides a process for forming a photoresist pattern using the photoresist composition described above. The process for forming a photoresist pattern includes the steps of:

(a) coating the photoresist composition described above on a substrate of semiconductor element to form a photoresist film;
(b) exposing said photoresist film to light using a light source; and
(c) developing the photoresist film to produce the photoresist pattern.

The photoresist composition of the present invention can be used in a single layer photoresist pattern formation process as described above. Alternatively, photoresist compositions of the present invention can be used in a bilayer photoresist pattern formation process, which generally involves coating the semiconductor substrate with a bottom anti-reflective coating material (BARC), g-line photoresist or i-line photoresist to produce a lower layer film, and coating the lower layer film with the photoresist composition described above to produce an upper layer photoresist film.

The photoresist pattern formation process can further include the steps of heating (i.e., baking) the substrate before and/or after the step (b) described above.

Moreover, in the bilayer photoresist pattern formation process, the baking step can be performed after forming the lower layer film.

In the single layer photoresist pattern formation process, the exposed photoresist film can be developed by contacting it with an alkaline developing solution under conditions sufficient to produce the photoresist pattern. In the bilayer photoresist pattern formation process, the exposed photoresist film can be developed by contacting the upper layer photoresist film with an alkaline solution under conditions sufficient to produce an upper layer photoresist pattern, and contacting the lower layer photoresist film with $O_2$ plasma using the upper layer photoresist pattern as a mask under conditions sufficient to produce the photoresist pattern. This bilayer photoresist pattern formation process is illustrated in FIG. 1, where the dry development is performed using $O_2$ plasma.

As illustrated in FIG. 1, a lower layer material 13 such as a bottom anti-reflective coating material (BARC), g-line photoresist or i-line photoresist, is coated on a wafer 11. Thereafter, the photoresist composition 15 of the present invention is coated on the lower layer material 13. The upper layer photoresist 15 is exposed to light using an exposure mask (A). Typically, the light source is ArF exposer ($\lambda$=193 nm), KrF exposer ($\lambda$=248 nm), VUV exposer ($\lambda$=157 nm), EUV exposer ($\lambda$=13 nm), E-beam or X-ray. The exposed upper layer photoresist film 15 is typically developed using 0.1 to 10 wt % aqueous tetramethylammonium hydroxide (TMAH) solution (B) to produce an upper layer photoresist pattern. Using the upper layer photoresist pattern as a mask, the lower layer material 13 is dry developed using $O_2$ plasma, thereby forming a lower layer material pattern. It is believed that during this $O_2$ plasma dry developing process, a silicon oxide film 17 is produced from the upper layer photoresist pattern which comprises the photoresist composition comprising silicon. The exposed lower layer material 13 and the silicon oxide film 17 is removed to form a photoresist pattern (C and D).

As discussed above, photoresist compositions of the present invention comprise a photoresist polymer which is derived from a relatively silicon rich photoresist monomer. Silicon present in photoresist compositions of the present invention (7 to 30% by weight of the photoresist polymer) forms a silicon dioxide film during a dry $O_2$ plasma etching process, thus providing a superior etching resistance. Therefore, even if a relatively inexpensive g-line or i-line photoresist, or general BARC is used as a lower layer film material, a photoresist pattern can be successfully produced using a thin film of photoresist composition of the present invention. For example, a photoresist film having a thickness of 2000 Å or less can be easily etched without the problems associated with conventional photoresist compositions. Since a thin photoresist film typically has a low light absorption, photoresist compositions of the present invention are useful in photolithography processes that use an ultrashort wavelength or an electron beam.

Yet another aspect of the present invention provides a semiconductor element manufactured using photoresist compositions and processes described above.

Additional objects, advantages, and novel features of this invention will become apparent to those skilled in the art upon examination of the following examples thereof, which are not intended to be limiting.

EXAMPLES

I. Preparation of Photoresist Monomers

Example 1

Synthesis of Ethylene Glycol 2,4,6,8-tetramethylcyclotetrasiloxanyl Ether Acrylate To a mixed solution containing 1 M of 2,4,6,8-tetramethylcyclotetrasiloxane and 0.01 g of $Zn(CH_3CO_2)_2$ was slowly added 1 M of 2-hydroxyethyl acrylate. The resulting mixture was stirred for 12 hours at a room temperature. Thereafter, 200 mL of benzene and 200 mL of cold water were added. The organic layer was separated, washed with 200 mL of cold water, dried over $MgSO_4$, filtered, and concentrated by distillation to provide the title compound of Formula 1A (yield: 97%).

Example 2

Synthesis of Ethylene Glycol 2,4,6,8-tetramethylcyclotetrasiloxanyl Ether 5-norbornene-2-carboxylate The procedure of Example 1 was repeated using 1 M of 2-hydroxyethyl-5-norbornene-2-carboxylate instead of 1 M of 2-hydroxyethyl acrylate and stirred for 24 hours instead of 12 hours to provide the title compound of Formula 2A (yield: 98%).

Example 3

Synthesis of (5-norbornene-2-methoxy)2,4,6,8-tetramethylcyclotetrasiloxane

The procedure of Example 1 was repeated using 1 M of 5-norbornene-2-methanol instead of 1 M of 2-hydroxyethyl acrylate to provide the title compound of Formula 3A (yield: 98%).

II. Preparation of Photoresist Polymers

Example 4

Synthesis of Poly(Neopentylglycol Diacrylate/methacrylic Acid/tert-butyl Methacrylate/ethyleneglycol 2,4,6,8-tetramethylcyclotetrasiloxanyl Ether Acrylate)

To 200 mL of tetrahydrofuran was added 0.01 mole of neopentylglycol diacrylate, 0.1 mole of methacrylic acid, 0.4 mole of tert-butyl methacrylate, 0.1 mole of ethyleneglycol 2,4,6,8-tetramethylcyclotetrasiloxanyl ether acrylate and 2.5 g of AIBN. The mixture was heated to 60° C. for 8 hours. Thereafter, 2 L of petroleum ether was added to the reaction mixture and the solid was filtered and dried to provide the title polymer of Formula 8A (yield: 83%).

Example 5

Synthesis of Poly(2,5-dimethyl-2,5-hexanediol Diacrylate/methacrylic Acid/tert-butyl Methacrylate/maleic Anhydride/ethyleneglycol 2,4,6,8-tetramethylcyclotetrasiloxanyl 5-norbornene-2-carboxylate)

The procedure of Example 4 was repeated using 0.01 mole of 2,5-dimethyl-2,5-hexanediol diacrylate, 0.1 mole of methacrylic acid, 0.4 mole of tert-butyl methacrylate, 0.2 mole of maleic anhydride, 0.2 mole of ethyleneglycol 2,4,6,8-tetramethylcyclotetrasiloxanyl 5-norbornene-2-carboxylate and 3 g of AIBN to provide the title polymer of Formula 9A (yield: 71%).

Example 6

Synthesis of Poly[2,5-dimethyl-2,5-hexanediol Diacrylate/methacrylic Acid/tert-butyl Methacrylate/maleic Anhydride/(5-norbornene-2-methoxy)ethyleneglycol 2,4,6,8-tetramethylcyclotetrasiloxane]

The procedure of Example 4 was repeated using 0.01 mole of 2,5-dimethyl-2,5-hexanediol diacrylate, 0.1 mole of methacrylic acid, 0.4 mole of tert-butyl methacrylate, 0.2 mole of maleic anhydride, 0.2 mole of (5-norbornene-2-methoxy)ethyleneglycol 2,4,6,8-tetramethylcyclotetrasiloxane and 3 g of AIBN to provide the title polymer of Formula 10A (yield: 74%).

III. Preparation of Photoresist Composition and Formation of Pattern

Example 7

A photoresist composition was prepared by adding 10 g of photoresist polymer prepared in Example 4 and 0.12 g of triphenylsulfonium triflate to 150 g of ethyl 3-ethoxypropionate solvent, and filtering the resultant mixture through 0.10 µm filter.

Figure 2:
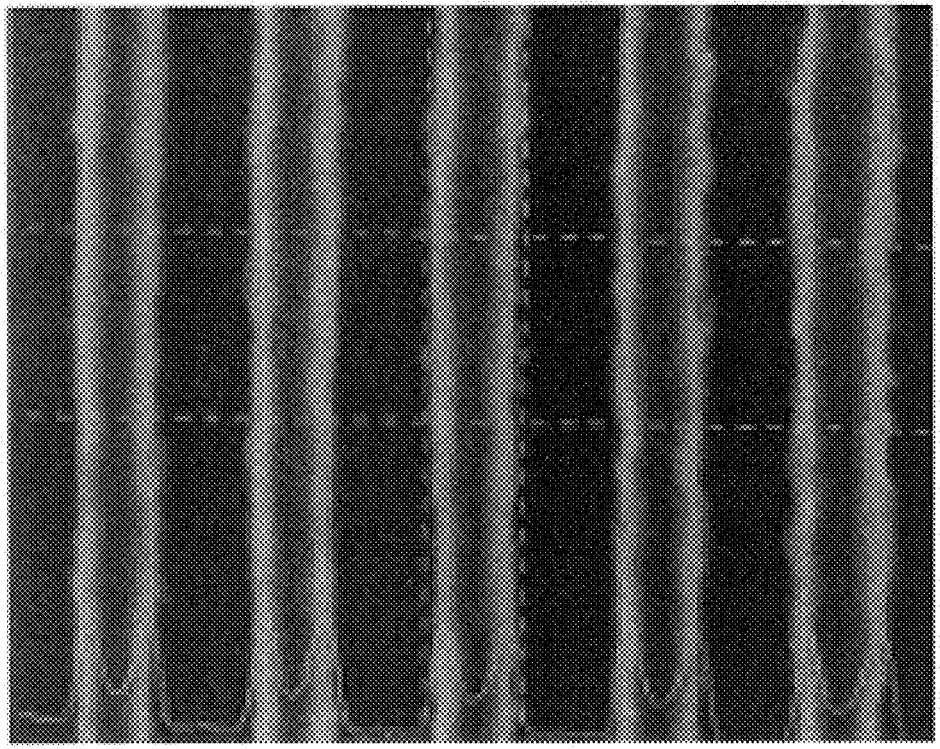
FIGS. 2 to 4 is a photograph showing patterns obtained in Examples 4 to 6.

I-line photoresist was coated on a silicon wafer to form a lower layer with a thickness of about 5000 Å. The coated silicon wafer was soft baked. Thereafter, 1 mL of the photoresist composition was spin coated on to the silicon wafer and baked at 130° C. for 90 seconds. The baked photoresist film was exposed to light using an ArF exposer and post-baked at 130° C. for 90 seconds [see FIG. 1 (A)]. The exposed photoresist film was developed using a 2.38 wt % aqueous TMAH solution to produce an upper layer photoresist pattern [see FIG. 1(B)]. The lower layer photoresist was dry developed with $O_2$ plasma using the upper layer pattern as a mask to form a lower layer photoresist pattern. It was observed that during the $O_2$ plasma dry etching process a silicon oxide film was produced from the upper layer photoresist pattern containing silicon. The exposed lower layer photoresist and the silicon oxide film were removed [see FIGS. 1(C) and 1(D), respectively] to provide a photoresist pattern of 0.13 µm L/S (see FIG. 2).

Example 8

Figure 3:
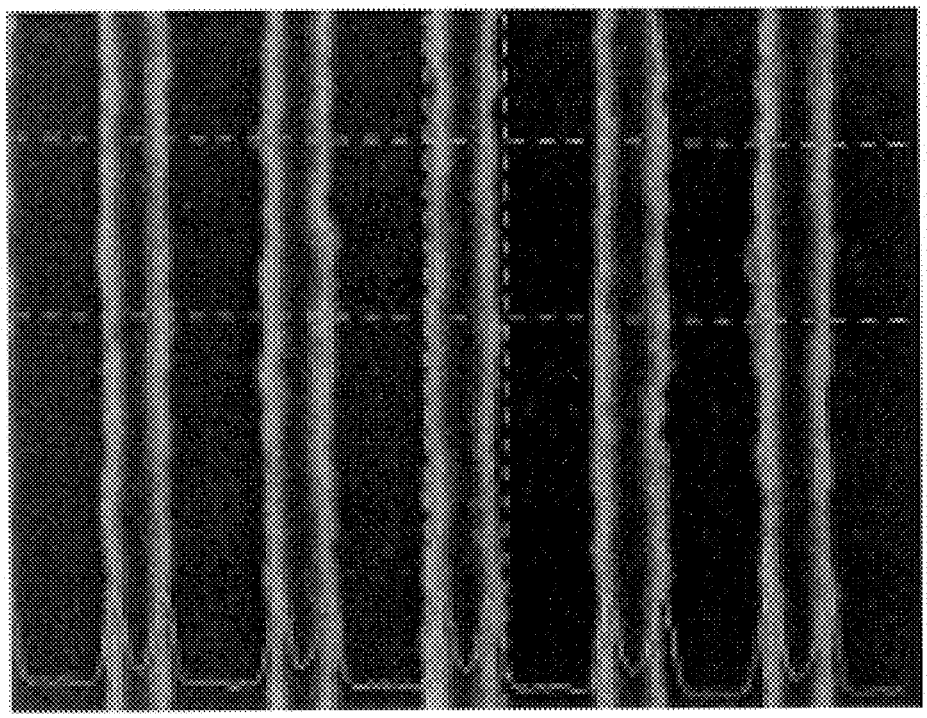

The procedure of Example 7 was repeated using 10 g of photoresist polymer prepared in Example 5 to produce a photoresist pattern of 0.12 µm L/S (see FIG. 3).

Example 9

Figure 4:
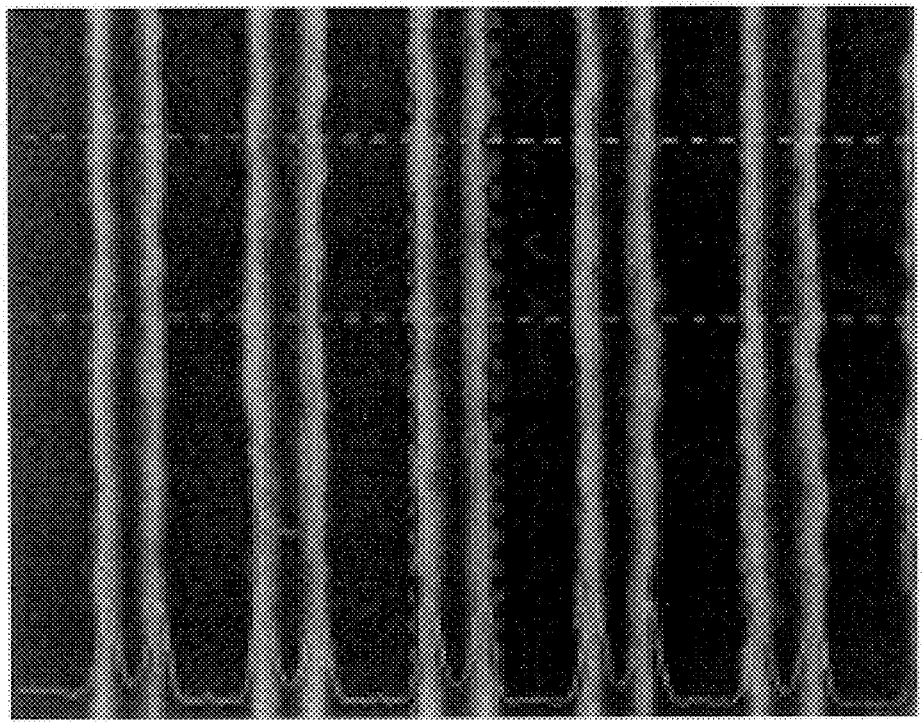

The procedure of Example 7 was repeated using 10 g of photoresist polymer prepared in Example 6 to produce a photoresist pattern of 0.12 μm L/S (see FIG. 4).

As discussed above, photoresist compositions of the present invention are produced using a silicon-rich photoresist monomer. The photoresist composition contains a proper amount of silicon, i.e., about 7 to about 30% by weight of the photoresist polymer. When etched by oxygen, the photoresist composition of the present invention forms a silicon oxide film resulting in a superior etching resistance relative to conventional photoresist compositions. Therefore, even if a relatively inexpensive g-line or i-line photoresist, or general BARC is used as a lower layer film material, a photoresist pattern can be successfully produced using a thin film of photoresist composition of the present invention, e.g., thickness of 2000 Å or less. Moreover, a bilayer photoresist pattern forming process can be used to produce a minute pattern without any significant pattern collapse resulting in a significant reduction in the production cost of semiconductor devices. Furthermore, a photoresist film having a thickness of 2000 Å or less can be easily etched without the problems associated with conventional photoresist compositions. Since a thin photoresist film typically has a low light absorption, photoresist compositions of the present invention are useful in photolithography processes that use an ultrashort wavelength or an electron beam.

In some embodiment, photoresist polymers of the present invention include diacrylate cross-linking monomers which increases the polymerization yield. This cross-linking can also improve a contrast ratio between the exposed region and the non-exposed region.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A photoresist polymer derived from a monomer comprising:

(i) a first monomer selected from the group consisting of compounds of the formula:

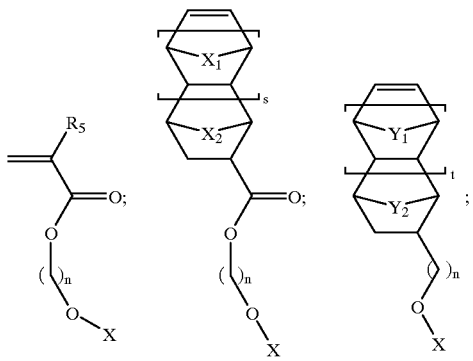

and mixtures thereof,
    wherein
    $X_1$, $X_2$, $Y_1$ and $Y_2$ are alkylene;
    $R_5$ is hydrogen or alkyl;
    s and t are integers from 0 to 2;
    n is an integer from 1 to 5; and
    X is a moiety of the formula:

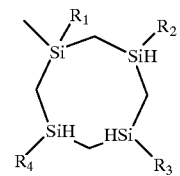

wherein
    each of $R_1$, $R_2$, $R_3$ and $R_4$ is independently hydrogen, $C_1$–$C_{10}$ alkyl, or $C_1$–$C_{10}$ alkyl comprising an ether linkage;

(ii) a second monomer of the formula:

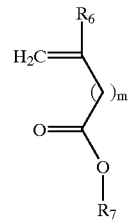

wherein
    $R_6$ is hydrogen or alkyl;
    $R_7$ is an acid labile protecting group; and
    m is an integer from 0 to 5; and (iii) a third monomer of the formula:

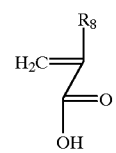

wherein
    $R_8$ is hydrogen or alkyl.

2. The photoresist polymer of claim 1, wherein each of $X_1$, $X_2$, $Y_1$ and $Y_2$ is independently methylene or ethylene.

3. The photoresist polymer of claim 1, wherein $R_5$ is hydrogen or methyl.

4. The photoresist polymer of claim 1, wherein $R_6$ is hydrogen or methyl.

5. The photoresist polymer of claim 1, wherein $R_8$ is hydrogen or methyl.

6. The photoresist polymer of claim 1, wherein said first monomer is selected from the group consisting of compounds of the formula:

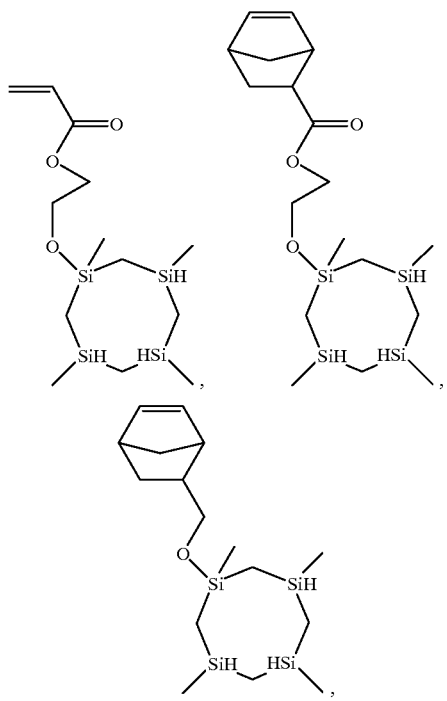

and mixtures thereof.

7. The photoresist polymer of claim 1, wherein said acid labile protecting group is selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl and 2-acetylmenth-1-yl.

8. The photoresist polymer of claim 1, wherein said monomer further comprises a cross-linking monomer of the formula:

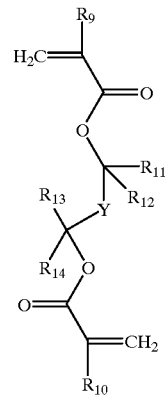

wherein
Y is $C_1$–$C_{12}$ alkylene, oxygen, or $C_1$–$C_{12}$ alkylene comprising an ether linkage;

each of $R_9$ and $R_{10}$ is independently hydrogen or alkyl; and each of $R_{11}$, $R_{12}$, $R_{13}$ and $R_{14}$ is independently hydrogen, $C_1$–$C_{12}$ alkyl, or $C_1$–$C_{12}$ alkyl comprising an ether linkage.

9. The photoresist polymer of claim 8, wherein $R_9$ and $R_{10}$ is independently hydrogen or methyl.

10. The photoresist polymer of claim 8, wherein said monomer further comprises maleic anhydride.

11. The photoresist polymer of claim 10, wherein said photoresist polymer is selected from the group consisting of polymers of the formula:

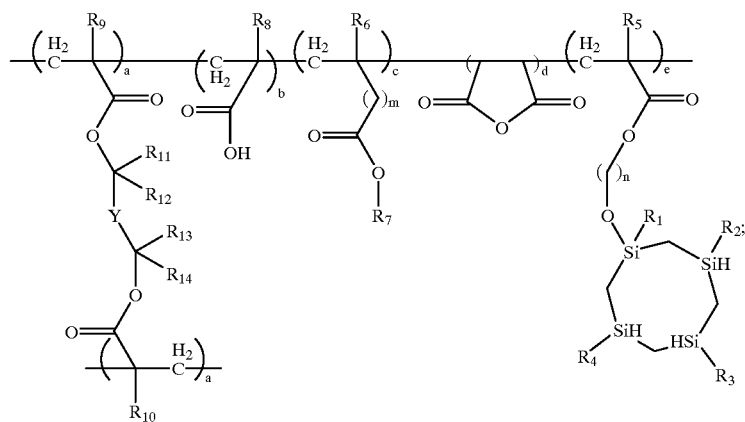

-continued

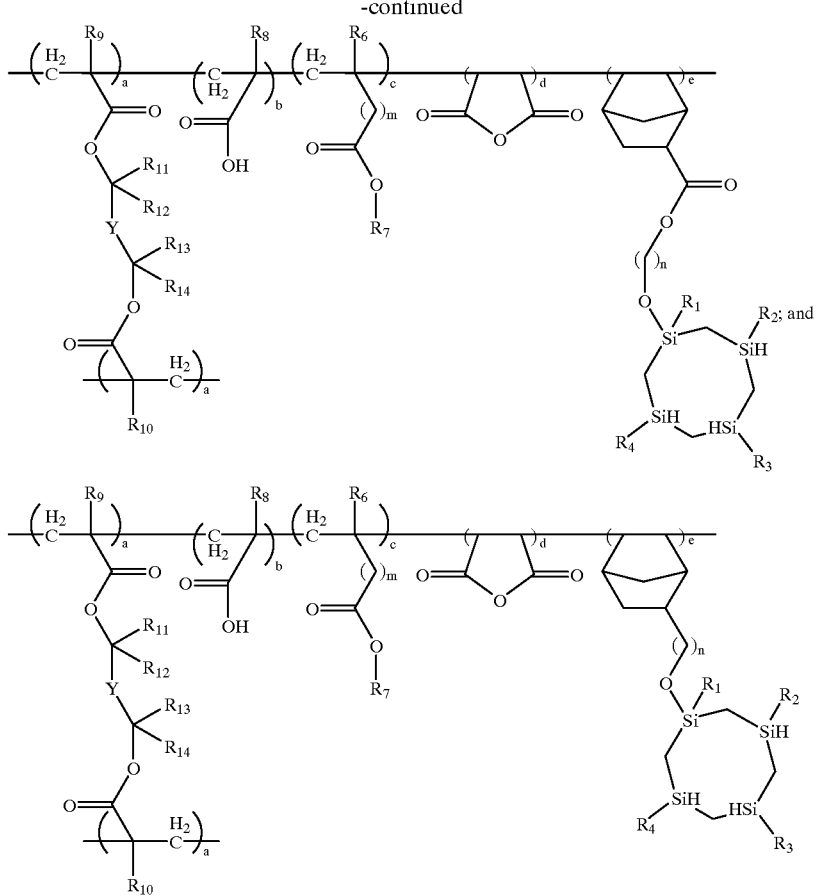

wherein
  $R_1$, $R_2$, $R_3$, $R_4$, $R_5$, $R_6$, $R_7$, $R_8$, and n are those defined in claim 1;
  each of $R_9$ and $R_{10}$ is independently hydrogen or alkyl;
  each of $R_{11}$, $R_{12}$, $R_{13}$ and $R_{14}$ is independently hydrogen, $C_1$–$C_{12}$ alkyl, or $C_1$–$C_{12}$ alkyl comprising an ether linkage; and
  a, b, c, d, and e individually denote a mole ratio of each monomer.

12. The photoresist polymer of claim 11, wherein the ratio of a:b:c:d:e is 0–15 mol %: 1–25 mol %: 4–25 mol %: 0–30 mol %: 1–35 mol %.

13. The photoresist polymer of claim 11, wherein each of $R_5$, $R_6$, $R_8$, $R_9$, and $R_{10}$ is independently hydrogen or methyl.

14. The photoresist polymer of claim 1, wherein said photoresist polymer is selected from the group consisting of compounds of the formula:

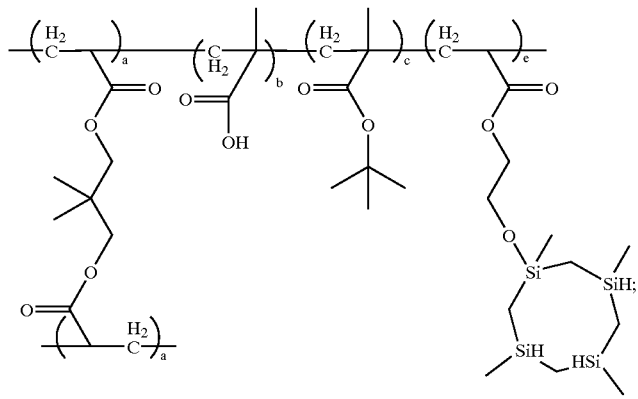

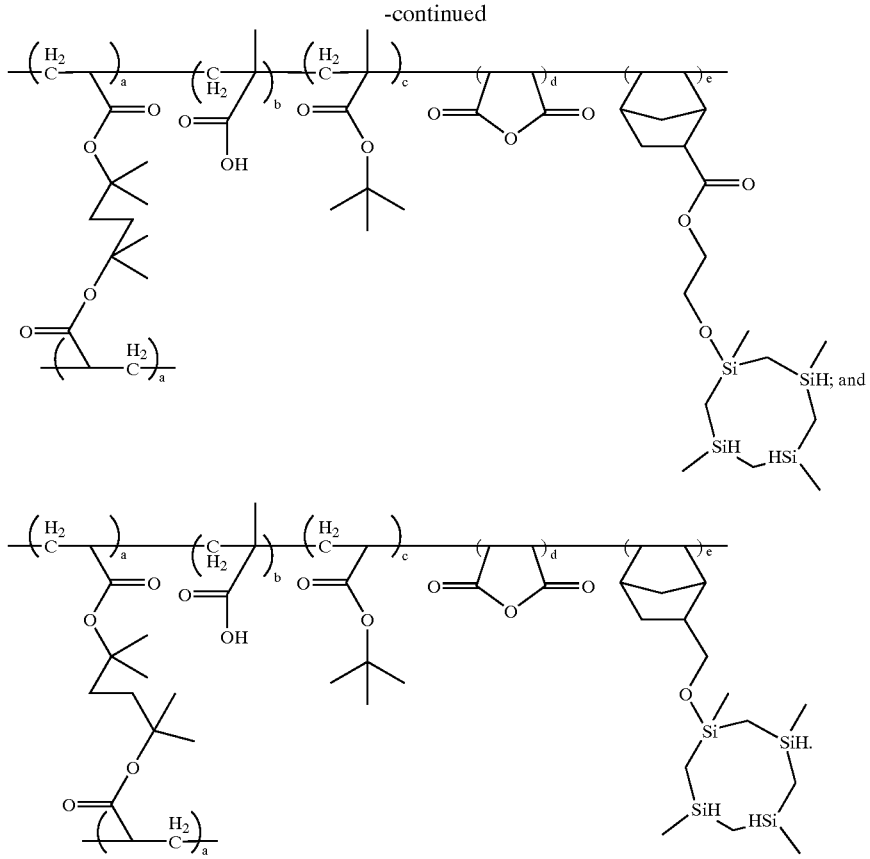

15. The photoresist polymer of claim 1, wherein the molecular weight of said photoresist polymer is in the range of from about 3,000 to about 50,000.

16. A process for preparing a photoresist polymer, comprising the steps of:
   (a) admixing
      (i) a first monomer selected from the group consisting of compounds of following formula:

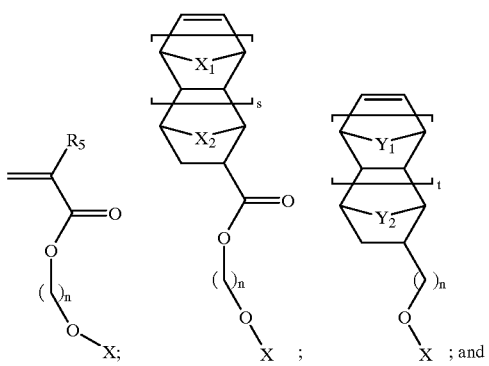

mixtures thereof,
   wherein
      $X_1$, $X_2$, $Y_1$ and $Y_2$ are alkylene;
      $R_5$ is hydrogen or alkyl;
      s and t are integers from 0 to 2;
      n is an integer from 1 to 5; and X is a moiety of the formula:

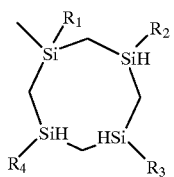

wherein
   each of $R_1$, $R_2$, $R_3$ and $R_4$ is independently hydrogen, $C_1$–$C_{10}$ alkyl, or $C_1$–$C_{10}$ alkyl comprising an ether linkage;
   (ii) a second monomer of the formula:

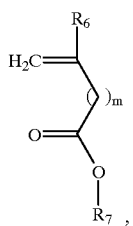

wherein
   $R_6$ is hydrogen or alkyl;
   $R_7$ is an acid labile protecting group; and
   m is an integer from 0 to 5;

(iii) a third monomer of the formula:

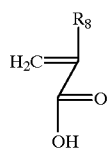

wherein
R$_8$ hydrogen or alkyl; and
(iv) a compound of the formula:

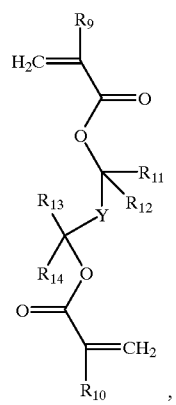

maleic anhydride, or mixtures thereof,
wherein
each of R$_9$, and R$_{10}$ is independently hydrogen or alkyl;
Y is C$_1$–C$_{12}$ alkylene, oxygen, or C$_1$–C$_{12}$ alkylene comprising an ether linkage; and
each of R$_{11}$, R$_{12}$, R$_{13}$ and R$_{14}$ is independently hydrogen, C$_1$–C$_{12}$ alkyl, or C$_1$–C$_{12}$ alkyl comprising an ether linkage;
(b) polymerizing said admixture under conditions sufficient to produce said photoresist polymer.

17. The process of claim 16, wherein each of X$_1$, X$_2$, Y$_1$ and Y$_2$ is independently methylene or ethylene.

18. The process of claim 16, wherein each of R$_5$, R$_6$, R$_8$, R$_9$, and R$_{10}$ is independently hydrogen or methyl.

19. The process of claim 16, wherein said admixing step further comprises a solvent selected from the group consisting of tetrahydrofuran, dimethylformamide, chloroform, ethylacetate, acetone, ethylmethylketone, dimethylsulfoxide, dioxane, benzene, toluene, xylene, diethylether, petroleum ether, n-hexane, cyclohexane, methanol, ethanol, propanol and isopropylalcohol.

20. The process of claim 16, wherein said admixture further comprises a polymerization initiator selected from the group consisting of 2,2'-azobisisobutyronitrile (AIBN), benzoyl peroxide, acetyl peroxide, lauryl peroxide, tert-butyl peroxide and bisazide compounds.

21. A photoresist composition comprising:
(a) photoresist polymer;
(b) a photoacid generator; and
(c) an organic solvent,
wherein
said photoresist polymer is derived from a monomer comprising:
(i) a first monomer selected from the group consisting of compounds of the formula:

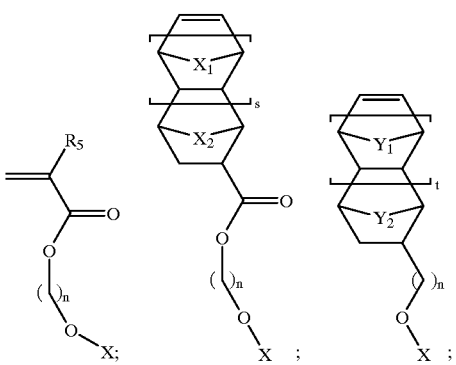

and mixtures thereof,
wherein
X$_1$, X$_2$, Y$_1$ and Y$_2$ are alkylene;
R$_5$ is hydrogen or alkyl;
s and t are integers from 0 to 2;
n is an integer from 1 to 5; and
X is a moiety of the formula:

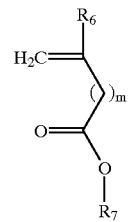

wherein
each of R$_1$, R$_2$, R$_3$ and R$_4$ is independently hydrogen, C$_1$–C$_{10}$ alkyl, or C$_1$–C$_{10}$ alkyl comprising an ether linkage;
(ii) a second monomer of the formula:

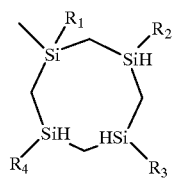

wherein
R$_6$ is hydrogen or alkyl;
R$_7$ is an acid labile protecting group; and
m is an integer from 0 to 5; and
(iii) a third monomer of the formula:

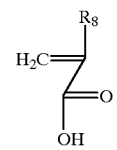

wherein
R$_8$ is hydrogen or alkyl.

22. The photoresist composition of claim 21, wherein said photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutyl-naphthylsulfonium triflate, and mixtures thereof.

23. The photoresist composition of claim 21, wherein the amount of said photoacid generator ranges from about 0.05 to about 10% by weight of said photoresist polymer.

24. The photoresist composition of claim 21, wherein said organic solvent is selected from the group consisting of cyclohexanone, cyclopentanone, methyl 3-methoxypropionate, ethyl 3-ethoxypriopionate and propyleneglycol methyletheracetate.

25. The photoresist composition of claim 21, wherein the amount of said organic solvent ranges from about 500 to about 2000% by weight of said photoresist polymer.

26. A process for forming a photoresist pattern, comprising the steps of:
   (a) coating a photoresist composition on a substrate of a semiconductor element to form a photoresist film;
   (b) exposing said photoresist film to light using a light source; and
   (c) developing said photoresist film to produce said photoresist pattern, wherein said photoresist composition comprises:
   (i) photoresist polymer;
   (ii) a photoacid generator; and
   (iii) an organic solvent, wherein said photoresist polymer is derived from a monomer comprising:
   (A) a first monomer selected from the group consisting of compounds of the formula:

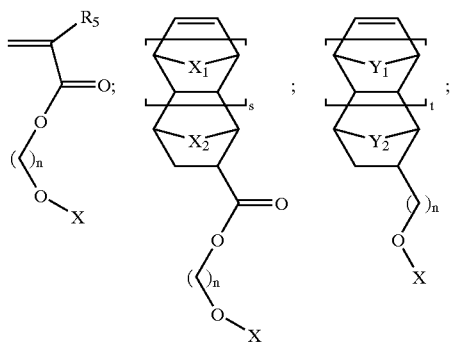

and mixtures thereof,
wherein $X_1$, $X_2$, $Y_1$ and $Y_2$ are alkylene;
$R_5$ is hydrogen or alkyl;
s and t are integers from 0 to 2;
n is an integer from 1 to 5; and X is a moiety of the formula:

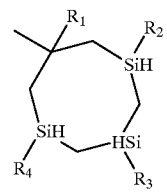

wherein each of $R_1$, $R_2$, $R_3$ and $R_4$ is independently hydrogen, $C_1$–$C_{10}$ alkyl, or $C_1$–$C_{10}$ alkyl comprising an ether linkage;

(B) a second monomer of the formula:

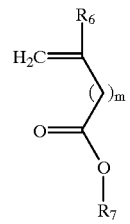

wherein $R_6$ is hydrogen or alkyl;
$R_7$ is an acid labile protecting group; and
m is an integer from 0 to 5; and (C) a third monomer of the formula:

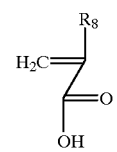

wherein $R_8$ is hydrogen or alkyl.

27. The process according to claim 26, further comprising the steps of producing a lower layer film by coating a bottom anti-reflective coating material, g-line photoresist or i-line photoresist on said substrate, and producing an upper layer photoresist film by coating said photoresist composition on said lower layer film.

28. The process according to claim 27 further comprising heating said substrate after forming said lower layer film.

29. The process according to claim 26 further comprising heating said substrate before and/or after said step (b).

30. The process according to claim 26, wherein said light source is ArF exposer, KrF exposer, VUV exposer, EUV exposer, E-beam or X-ray.

31. The process according to claim 26, wherein said developing step comprises contacting said exposed photoresist film with an alkaline solution.

32. The process according to claim 27, wherein said developing step comprises the steps of:

(i) producing an upper layer photoresist pattern by contacting said upper layer photoresist film with an alkaline solution under conditions sufficient to produce said upper layer photoresist pattern; and (ii) producing a lower layer photoresist pattern by contacting said lower layer photoresist film with $O_2$ plasma using said upper layer photoresist pattern as a mask under conditions sufficient to produce said lower layer photoresist pattern.

33. A semiconductor element manufactured by the process according to claim 26.

* * * * *

UNITED STATES PATENT AND TRADEMARK OFFICE
CERTIFICATE OF CORRECTION

PATENT NO.    : 6,569,599 B2
DATED         : May 27, 2003
INVENTOR(S)   : Geun-Su Lee et al.

It is certified that error appears in the above-identified patent and that said Letters Patent is hereby corrected as shown below:

Column 24,
Line 5, please delete this formula and replace it with the following formula:

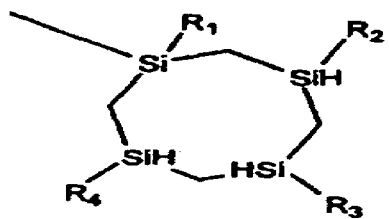

Signed and Sealed this

Twenty-fourth Day of February, 2004

JON W. DUDAS
*Acting Director of the United States Patent and Trademark Office*